United States Patent
Chang et al.

(10) Patent No.: US 6,835,897 B2
(45) Date of Patent: Dec. 28, 2004

(54) WARPAGE PREVENTING SUBSTRATE

(75) Inventors: Chin-Huang Chang, Taichung (TW); Chin-Tien Chiu, Taichung (TW); Cheng-Lun Liu, Taichung (TW)

(73) Assignee: Siliconware Precision Industries Co., Ltd. (TW)

( * ) Notice: Subject to any disclaimer, the term of this patent is extended or adjusted under 35 U.S.C. 154(b) by 0 days.

(21) Appl. No.: 10/309,564

(22) Filed: Dec. 4, 2002

(65) Prior Publication Data

US 2004/0065473 A1 Apr. 8, 2004

(30) Foreign Application Priority Data

Oct. 8, 2002 (TW) .................................. 91123174 A

(51) Int. Cl.⁷ ............................................... H05K 1/03
(52) U.S. Cl. ....................... 174/255; 174/254; 174/261; 361/777
(58) Field of Search ............................... 174/261, 260, 174/254, 255, 262; 361/792, 795, 760, 777; 257/737, 778, 738

(56) References Cited

U.S. PATENT DOCUMENTS

| | | | | |
|---|---|---|---|---|
| 5,030,799 A | * | 7/1991 | Fukuta ........................ | 174/250 |
| 5,473,119 A | | 12/1995 | Rosenmayer et al. ....... | 174/255 |
| 5,677,575 A | * | 10/1997 | Maeta et al. ................ | 257/778 |
| 6,115,262 A | * | 9/2000 | Brunner et al. ............. | 361/774 |
| 6,198,165 B1 | * | 3/2001 | Yamaji et al. ............... | 257/734 |
| 6,204,559 B1 | * | 3/2001 | Lin et al. ..................... | 257/738 |
| 6,490,170 B2 | * | 12/2002 | Asai et al. ................... | 361/794 |
| 6,507,100 B1 | * | 1/2003 | Valluri et al. ............... | 257/697 |

FOREIGN PATENT DOCUMENTS

| | | | | |
|---|---|---|---|---|
| JP | 401300590 A | * | 12/1989 |
| JP | 403045398 A | * | 2/1991 |
| JP | 404188886 A | * | 7/1992 |
| JP | 405299785 A | * | 11/1993 |
| JP | 2001284491 A | * | 10/2001 |
| JP | 020012844491 A | * | 10/2001 |

* cited by examiner

*Primary Examiner*—Kamand Cuneo
*Assistant Examiner*—I B Patel
(74) *Attorney, Agent, or Firm*—Peter F. Corless; Steven M. Jensen; Edwards & Angell, LLP

(57) ABSTRACT

A warpage preventing substrate is provided. A plurality of first and second conductive traces are respectively formed on a first surface and a second surface of a core layer of the substrate, each conductive trace having a terminal, and a plurality of first and second non-functional traces are respectively formed on the first and second surfaces of the core layer at area free of the conductive traces. The first non-functional traces are arranged in different density from the second non-functional traces in a manner that, stress generated from the first conductive traces and first non-functional traces counteracts stress generated from the second conductive traces and second non-functional traces, to thereby prevent warpage of the substrate and maintain flatness of the substrate.

10 Claims, 3 Drawing Sheets

WARPAGE PREVENTING SUBSTRATE

FIELD OF THE INVENTION

The present invention relates to substrates for use in semiconductor packages, and more particularly, to a substrate for preventing warpage of the substrate.

BACKGROUND OF THE INVENTION

A substrate for use as a chip carrier in a semiconductor package is generally formed with a core layer made of a resin material such as epoxy resin, polyimide resin, BT (bismaleimide triazine) resin or FR4 resin. A copper film is attached to opposing upper and lower surfaces of the core layer respectively, and subjected to exposing, developing and etching processes to pattern the copper film to form a plurality of conductive traces, each of the conductive traces having a terminal. Then, solder mask is applied over the upper and lower surfaces of the core layer to form a protective layer that covers the conductive traces but exposes the terminals of the conductive traces; this protective layer protects the conductive traces against external moisture and contaminant. The exposed terminals of the conductive traces may serve as ball pads or bond fingers to be subsequently bonded with conductive elements such as solder balls or bonding wires.

When using the above substrate in package fabrication processes, the upper and lower surfaces of the core layer usually function differently; for example, the upper surface is used to accommodate chips, and the lower surface may be implanted with a plurality of conductive elements such as solder balls to be in electrical connection externally, such that conductive traces formed on the upper surface of the core layer are arranged differently from those on the lower surface of the core layer. As a result, due to great mismatch in coefficient of thermal expansion (CTE) between copper-made conductive traces and the core layer, the substrate would warp under temperature variation. FIGS. 5A and 5B illustrate a warped substrate 1, which comprises: a core layer 10; an upper metal layer 11 formed of a plurality of copper-made conductive traces on an upper surface 12 of the core layer 10; a lower metal layer 13 formed of a plurality of copper-made conductive traces on a lower surface 14 of the core layer 10; an upper solder mask layer 15 applied over the upper metal layer 11 for covering the conductive traces; and a lower solder mask layer 16 applied over the lower metal layer 13 for covering the conductive traces.

As shown in FIG. 5A, when metal (copper) content of the upper metal layer 11 is less than that of the lower metal layer 13, under temperature variation in fabrication processes such as substrate baking, encapsulant curing and subsequent thermal cycles, the upper and lower metal layers 11, 13 generate different thermal stress in a manner that, the lower metal layer 13 deforms or shrinks to a greater extent than the upper metal layer 11, making the substrate 1 warped or bent downwardly.

As shown in FIG. 5B, if metal content of the upper metal layer 11 is greater than that of the lower metal layer 13, under temperature variation, the upper metal layer 11 would deform or shrink to a greater extent than the lower metal layer 13, making the substrate 1 warped or bent upwardly.

In order to solve the above substrate problem caused by CTE mismatch, U.S. Pat. No. 5,473,119 discloses a substrate with stress absorbing means. As shown in FIG. 6, this substrate 2 is composed of a support layer or core layer 20, a stress-relieving layer 21 and a conductive layer 22 having a plurality of conductive traces. The stress-relieving layer 21 is made of expanded polytetrafluoroethylene (PTFE) and has compressive modulus smaller than 50,000 pounds per square inch, wherein the expanded PTFE has high porosity, a very low dielectric constant and very low CTE.

When an electronic element such as semiconductor chip 23 is mounted and electrically connected to the substrate 2 via solder bumps 24, under temperature variation in subsequent fabrication processes, the stress-relieving layer 21 would absorb CTE-induced stress effect between the semiconductor chip 23 and the substrate 2 to thereby prevent cracking of the solder bumps 24, such that structural intactness and electrical connection quality can be assured.

The above substrate 2 with the stress-relieving layer 21 indeed eliminates structural damage caused by CTE mismatch. However, provision of the stress-relieving layer 21 on the support layer or core layer 20 increases thickness of the substrate 2, and is not favorable for miniaturization of package profile. Moreover, fabrication of the stress-relieving layer 21 increases production complexity and costs of the substrate 2, thereby not compliant with economic concern of package production.

SUMMARY OF THE INVENTION

A primary objective of the present invention is to provide a warpage preventing substrate, wherein traces formed on opposing surfaces of the substrate are balanced in stress generation under temperature variation, to thereby prevent warpage of the substrate and maintain flatness of the substrate, such that quality and yield of fabricated package products with the substrate can be assured.

Another objective of the invention is to provide a warpage preventing substrate, which would not increase thickness and fabrication costs of the substrate, in favor of low profile and low cost concerns for package products with the substrate.

In accordance with the above and other objectives, the present invention proposes a warpage preventing substrate, comprising: a core layer having a first surface and a second surface opposed to the first surface; a plurality of first conductive traces and second conductive traces respectively formed on the first surface and the second surface of the core layer, each of the conductive traces having a terminal; a plurality of first non-functional traces and second non-functional traces respectively formed on the first surface and the second surface of the core layer at area free of the conductive traces, wherein the first non-functional traces are arranged in different density from the second non-functional traces, so as to allow stress generated from the first conductive traces and first non-functional traces on the first surface of the core layer to counteract stress generated from the second conductive traces and second non-functional traces on the second surface of the core layer, to thereby assure flatness of the substrate; and an insulating layer applied over each of the first and second surfaces of the core layer, for covering the conductive traces and non-functional traces, with the terminals of the conductive traces being exposed to outside of the insulating layers.

When the above substrate is applied to package fabrication processes, under temperature variation in fabrication processes such as substrate baking, encapsulant curing and subsequent thermal cycles, by different-density arrangement of the first and second non-functional traces to balance contents of metal (used for making conductive and non-functional traces) deposited on the first and second surfaces of the core layer, thermal stress generated from the first conductive traces and first non-functional traces on the first surface of the core layer can counteract thermal stress generated from the second conductive traces and second non-functional traces on the second surface of the core layer, such that the substrate can be prevented from warpage and remains flat, and quality and yield of package products with the substrate can be assured. Furthermore, the first and second non-functional traces are simultaneously formed with the first and second conductive traces, which would not increase thickness and fabrication costs of the substrate in favor of low profile and low cost concerns for package products with the substrate.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

Figure 2:
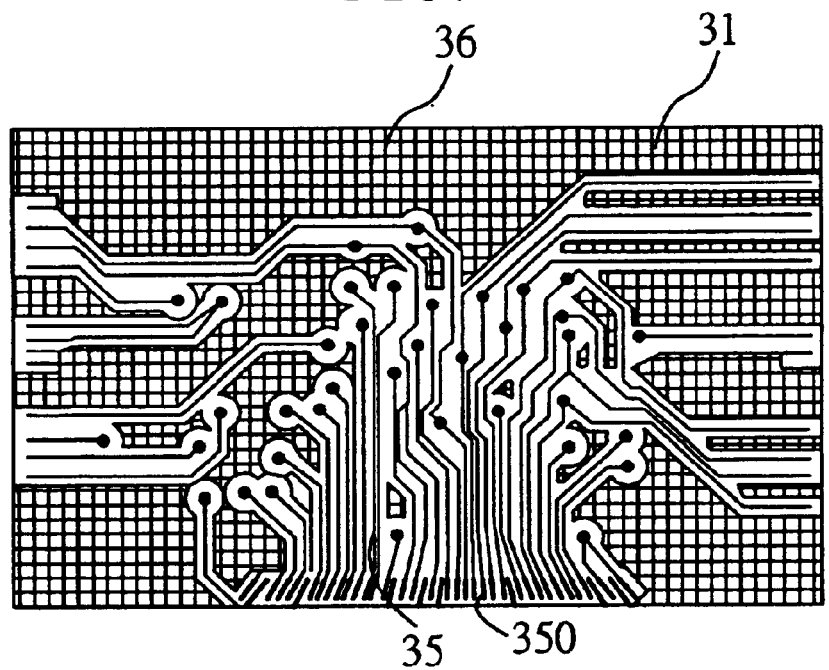
FIG. 2 is a top view of trace arrangement on the substrate shown in FIG. 1.
Figure 3:
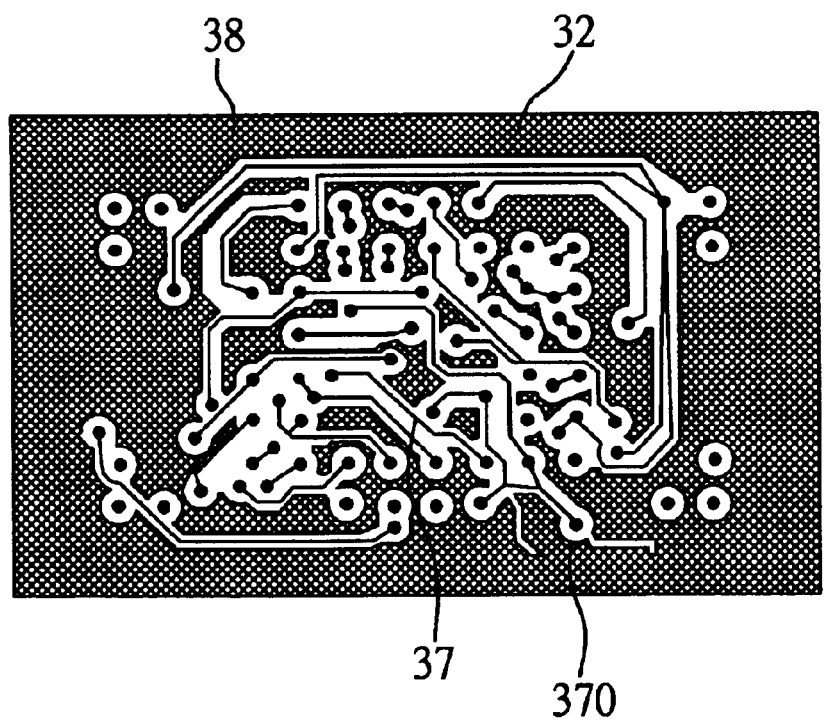
FIG. 3 is a bottom view of trace arrangement on the substrate shown in FIG. 1.

A warpage preventing substrate proposed in the present invention is described in detail with reference to FIGS. 1-3 as follows.

Figure 1:
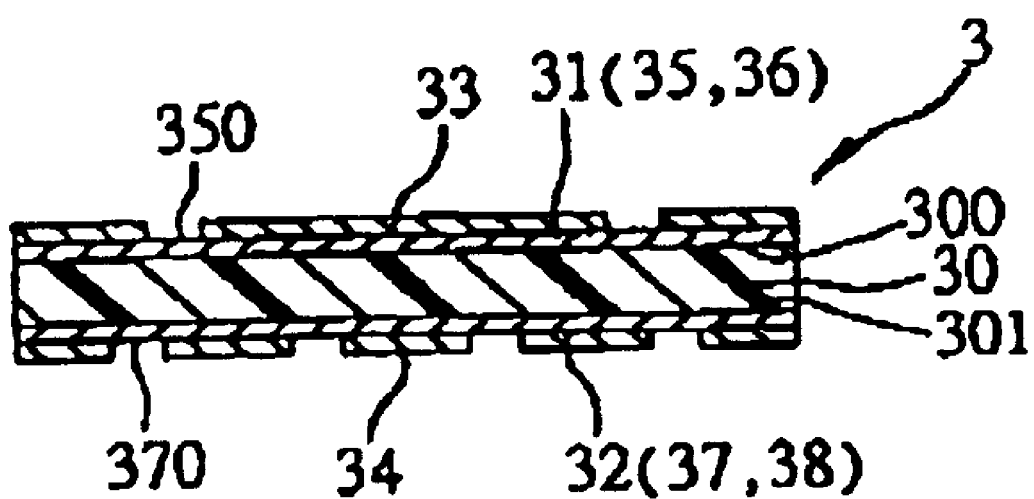
FIG. 1 is a cross-sectional view of a substrate according to the invention.

As shown in FIG. 1, the substrate 3 according to the invention comprises: a core layer 30; a first metal layer 31 and a second metal layer 32 respectively formed on opposing surfaces of the core layer 30; and insulating layers 33, 34 respectively applied over the first and second metal layers 31, 32.

The core layer 30 has a first surface 300 and a second surface 301 opposed to the first surface 300. The core layer 30 is made of a resin material such as epoxy resin, polyimide resin, BT (bismaleimide triazine) resin or FR4 resin. Structure and fabrication of the core layer 30 are conventional and not to be further detailed herein.

The first metal layer 31 is formed by attaching at least a copper film 31 (designated by the same reference numeral as the first metal layer) to the first surface 300 of the core layer 30; the copper film 31 is subject to conventional exposing, developing and etching processes to pattern the copper film 31 to form a plurality of first conductive traces 35 at predetermined positions on the core layer 30, each of the first conductive traces 35 having a terminal (bond finger) 350, and to form a plurality of first non-functional traces 36 on the first surface 300 of the core layer 30 at area free of the first conductive traces 35. The first non-functional traces 36 are dummy traces and arranged (but not limited to) in a mesh manner, as shown in FIG. 2.

Similarly, the second metal layer 32 is formed by attaching at least a copper film 32 (designated by the same reference numeral as the second metal layer) to the second surface 301 of the core layer 30, and patterning the copper film 32 to form a plurality of second conductive traces 37, each of the second conductive traces 37 having a terminal (ball pad) 370, and to form a plurality of second non-functional traces 38 on the second surface 301 of the core layer 30 at area free of the second conductive traces 37. The second non-functional traces 38 are dummy traces and arranged (but not limited to) in a mesh manner, as shown in FIG. 3.

When the substrate 3 is applied to package fabrication processes, the first and second surfaces 300, 301 of the core layer 30 usually function differently; for example, the first surface 300 may be used to accommodate chips (not shown), and the second surface 301 may be implanted with a plurality of conductive elements such as solder balls (not shown) to be in electrical connection externally, such that the first conductive traces 35 are arranged differently from the second conductive traces 37. As a result, under temperature variation in fabrication processes such as substrate baking, encapsulant curing and subsequent thermal cycles, the first and second conductive traces 35, 37 with different copper content would generate different thermal stress, thereby leading to warpage of the substrate 3. Therefore, the characteristic feature of this invention is to form the first and second non-functional traces 36, 38 respectively on the first and second surfaces 300, 301 of the core layer 30 at area free of the first and second conductive traces 35, 37. The first non-functional traces 36 are arranged in different density from the second non-functional traces 38 in a manner that, thermal stress generated from the first conductive traces 35 and first non-functional traces 36 on the first surface 300 of the core layer 30 can counteract thermal stress generated from the second conductive traces 37 and second non-functional traces 38 on the second surface 301 of the core layer 30, to thereby maintain flatness of the substrate 30. Moreover, copper content of the first conductive traces 35 and first non-functional traces 36 is of a ratio with respect to copper content of the second conductive traces 37 and second non-functional traces 38; this also helps prevent the substrate 3 from being warped.

Furthermore, the first and second non-functional traces 36, 38 are simultaneously formed with the first and second conductive traces 35, 37, which thereby would not increase thickness and fabrication costs of the substrate 3 in favor of low profile and low cost concerns for package products with the substrate 3.

The insulating layers such as solder mask layers 33, 34 are respectively applied over the first and second surfaces 300, 301 of the core layer 30, to cover the first and second conductive traces 35, 37 and the first and second non-functional traces 36, 38, wherein the bond fingers 350 of the first conductive traces 35 and the ball pads 370 of the second conductive traces 37 are exposed to outside of the insulating layers 33, 34. The insulating layers 33, 34 can protect the conductive traces 35, 37 and non-functional traces 36, 38 against external moisture and contaminant, and prevent short-circuiting problems in subsequent fabrication processes due to trace exposure that would adversely affect electrical quality of fabricated package products.

When the substrate 3 is applied to package fabrication processes, the exposed bond fingers 350 of the first conductive traces 35 are bonded with bonding wires (not shown), and the ball pads 370 of the second conductive traces 37 are subsequently implanted with solder balls or bumps (not shown); for example, if the first surface 300 of the core layer 30 is used to accommodate chips (not shown), the bond fingers 350 of the first conductive traces 35 can be bonded with bonding wires (not shown) that electrically connect chips to the substrate 3, and the ball pads 370 of the second conductive traces 37 can be implanted with solder balls (not shown) to be in electrical connection with an external device such as printed circuit board (PCB, not shown).

Moreover, by the above structural arrangement of the substrate 3, the first conductive traces 35 and first non-functional traces 36 deform in an extent substantially equivalent to the second conductive traces 37 and second non-functional traces 38 under temperature variation, thereby preventing warpage of the substrate 3.

Figure 4:
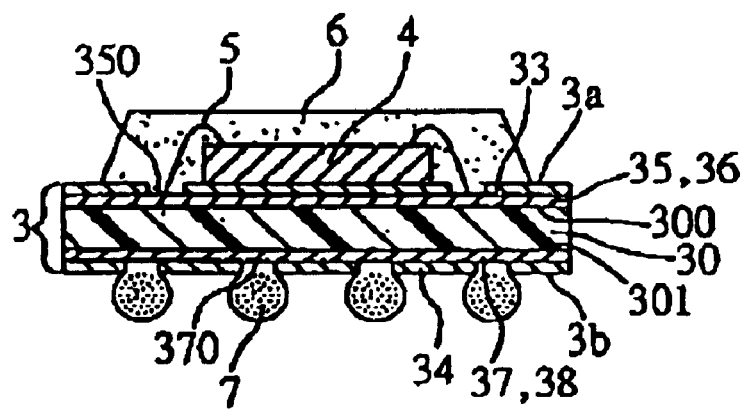
FIG. 4 is a cross-sectional view of semiconductor package with the substrate according to the invention.
Figure 5A:
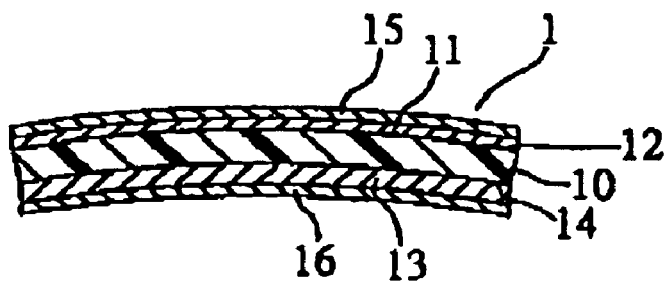
FIGS. 5A and 5B (PRIOR ART) are cross-sectional views of a conventional warped substrate.
Figure 5B:
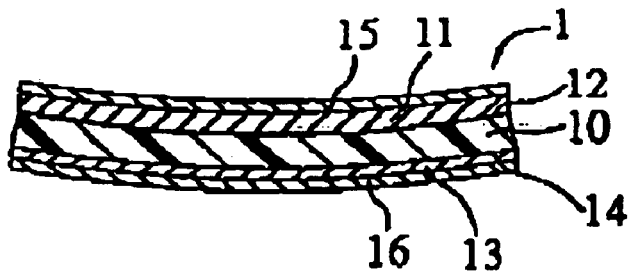
Figure 6:
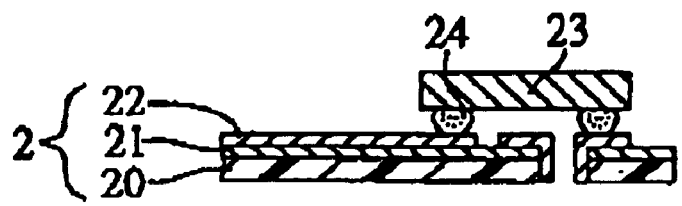
FIG. 6 is a cross-sectional view of a substrate disclosed in U.S. Pat. No. 5,473,119.

FIG. 4 illustrates a semiconductor package with the above substrate 3; a BGA (ball grid array) semiconductor package is exemplified herein. It is noted that the substrate 3 according to the invention is also suitable for other types of package structure such as flip-chip structure, or can be used as a circuit board e.g. PCB for accommodating semiconductor packages.

First, the above substrate 3 is prepared, and has a chip-attach surface 3a and a ball-attach surface 3b opposed to the chip-attach surface 3a, wherein the chip-attach surface 3a corresponds in position to the first surface 300 of the core layer 30, and the ball-attach surface 3b corresponds in position to the second surface 301 of the core layer 30. By different-density arrangement of the first non-functional traces 36 and second non-functional traces 38, under temperature variation in fabrication processes such as baking of the substrate 3, thermal stress generated from the chip-attach surface 3a (having first conductive traces 35, first non-functional traces 36 and insulating layer 33) would counteract thermal stress generated from the ball-attach surface 3b (having second conductive traces 37, second non-functional traces 38 and insulating layer 34) of the substrate 3; and, the chip-attach surface 3a would deform to an extent substantially equivalent to the ball-attach surface 3b, to thereby prevent warpage of the substrate 3 and maintain flatness of the substrate 3.

Then, a chip-bonding process is performed to mount at least a chip 4 on the chip-attach surface 3a of the substrate 3; a wire-bonding process is performed to form a plurality of bonding wires 5 such as gold wires that are bonded to the exposed bond fingers 350 of the first conductive traces 35 and to the chip 4, so as to electrically connect the chip 4 to the chip-attach surface 3a of the substrate 3.

A molding process is carried out to form an encapsulant 6 by a resin compound on the chip-attach surface 3a of the substrate 3, and the encapsulant 6 encapsulates and protects the chip 4 and bonding wires 5 against external moisture and contaminant.

After molding, a post molding curing (PMC) process is carried out, whereby the encapsulant 6 formed on the chip-attach surface 3a of the substrate 3 is subject to 175° C. for 6 hours to be cured. Under such a high temperature, since thermal stress from the chip-attach surface 3a counteracts that from the ball-attach surface 3b of the substrate 3, the substrate 3 can be prevented from warpage and remains flat.

Finally, a ball implantation process is performed to implant a plurality of solder balls 7 to the exposed ball pads 370 of the second conductive traces 37 on the ball-attach surface 3b of the substrate 3. The solder balls 7 serve as I/O (input/output) ports of the semiconductor package to electrically connect the chip 4 to an external device such as PCB (not shown).

Under subsequent temperature variable conditions such as package tests or thermal cycles, by different-density arrangement of the first non-functional traces 36 and second non-functional traces 38, thermal stress from the chip-attach surface 3a substantially balances with thermal stress from the ball-attach surface 3b, so as to prevent warpage of the substrate 3 and maintain flatness of the substrate 3, such that quality and yield of the above semiconductor package with the substrate 3 can be assured.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A warpage preventing substrate, comprising:
   a core layer having a first surface and a second surface opposed to the first surface;
   a plurality of first conductive traces and second conductive traces respectively formed on the first surface and the second surface of the core layer, each of the conductive traces having a terminal;
   a plurality of first non-functional traces and second non-functional traces respectively formed on the first surface and the second surface of the core layer at area free of the conductive traces, wherein the first non-functional traces are arranged in different density from the second non-functional traces, wherein the first conductive traces and the first non-functional traces deform to an extent substantially equivalent to deformation of the second conductive traces and the second non-functional traces under temperature variation, thereby preventing warpage of the substrate; and
   an insulating layer applied over each of the first and second surfaces of the core layer, for covering the conductive traces and non-functional traces, with the terminals of the conductive traces being exposed to outside of the insulating layers.

2. The substrate of claim 1, wherein the core layer is made of a resin material selected from the group consisting of epoxy resin, polyimide resin, BT (bismaleimide triazine) resin and FR4 resin.

3. The substrate of claim 1, wherein the conductive traces and the non-functional traces are made of copper.

4. The substrate of claim 1, wherein the non-functional traces are dummy traces.

5. The substrate of claim 1, wherein the non-functional traces are arranged in a mesh manner.

6. The substrate of claim 1, wherein the first conductive traces are arranged in a different pattern from the second conductive traces.

7. The substrate of claim 1, wherein the insulating layer is made of solder mask.

8. The substrate of claim 1, wherein the terminals of the conductive traces are used to be bonded with solder balls.

9. The substrate of claim 1, wherein the terminals of the conductive traces are used to be bonded with solder bumps.

10. The substrate of claim 1, wherein the terminals of the first conductive traces are used to be bonded with bonding wires, and the terminals of the second conductive traces are used to be implanted with solder balls.

* * * * *